United States Patent
Steuer et al.

(10) Patent No.: US 10,551,416 B2
(45) Date of Patent: Feb. 4, 2020

(54) MULTI-SENSOR CONFIGURATION FOR NON-CONTACT VOLTAGE MEASUREMENT DEVICES

(71) Applicant: Fluke Corporation, Everett, WA (US)

(72) Inventors: Ronald Steuer, Hinterbruhl (AT); Ricardo Rodriguez, Mill Creek, WA (US)

(73) Assignee: Fluke Corporation, Everett, WA (US)

( * ) Notice: Subject to any disclaimer, the term of this patent is extended or adjusted under 35 U.S.C. 154(b) by 53 days.

(21) Appl. No.: 15/974,990

(22) Filed: May 9, 2018

(65) Prior Publication Data

US 2019/0346493 A1    Nov. 14, 2019

(51) Int. Cl.
*G01R 19/25* (2006.01)
*G01R 19/155* (2006.01)

(52) U.S. Cl.
CPC ....... *G01R 19/2506* (2013.01); *G01R 19/155* (2013.01)

(58) Field of Classification Search
CPC .............. G01R 19/2506; G01R 19/155; G01R 31/2601; G01R 31/3183; G01R 31/319; G01R 31/2612
See application file for complete search history.

(56) References Cited

U.S. PATENT DOCUMENTS

| | | |
|---|---|---|
| 5,473,244 A | 12/1995 | Libove et al. |
| 5,583,444 A | 12/1996 | Nakamura et al. |

(Continued)

FOREIGN PATENT DOCUMENTS

| | | |
|---|---|---|
| CN | 2639905 Y | 9/2004 |
| EP | 1 249 706 B1 | 9/2007 |

(Continued)

OTHER PUBLICATIONS

Calmet Ltd., "Multifunction Calibrator of alternating and direct voltage current," downloaded on Feb. 7, 2018 from http://www.calmet.com.pl/images/pdf/C101F%20data%20sheet.pdf, 2012, 2 pages.

(Continued)

*Primary Examiner* — Dominic E Hawkins
(74) *Attorney, Agent, or Firm* — Seed Intellectual Property Law Group LLP (57) ABSTRACT

Systems and methods for measuring AC voltage of an insulated conductor are provided, without requiring a galvanic connection between the conductor and a test electrode or probe. A non-galvanic contact (or "non-contact") voltage measurement system includes a sensor subsystem, an internal ground guard and a reference shield. A common mode reference voltage source is electrically coupled between the internal ground guard and the reference shield to generate an AC reference voltage which causes a reference current to pass through the conductive sensor. Control circuitry receives a signal indicative of current flowing through the sensor subsystem due to the AC reference voltage and the AC voltage in the insulated conductor, and determines the AC voltage in the insulated conductor based at least in part on the received signal. The sensor subsystem includes at least two independent sensors that are used to compensate for conductor position while improving accuracy and dynamic range.

20 Claims, 5 Drawing Sheets

(56) References Cited

U.S. PATENT DOCUMENTS

| | | | |
|---|---|---|---|
| 5,973,501 | A | 10/1999 | Reichard |
| 6,014,027 | A | 1/2000 | Reichard |
| 6,043,640 | A | 3/2000 | Lauby et al. |
| 6,118,270 | A | 9/2000 | Singer et al. |
| 6,644,636 | B1 | 11/2003 | Ryan |
| 6,664,708 | B2 | 12/2003 | Schlimak et al. |
| 6,812,685 | B2 | 11/2004 | Steber et al. |
| 6,825,649 | B2 | 11/2004 | Nakano |
| 7,084,643 | B2 | 8/2006 | Howard et al. |
| 7,466,145 | B2 | 12/2008 | Yanagisawa |
| 8,054,061 | B2 | 11/2011 | Prance et al. |
| 8,222,886 | B2 | 7/2012 | Yanagisawa |
| 8,680,845 | B2 | 3/2014 | Carpenter et al. |
| 8,803,506 | B2 | 8/2014 | Yanagisawa |
| 9,063,184 | B2 | 6/2015 | Carpenter et al. |
| 9,201,100 | B2 | 12/2015 | Yanagisawa |
| 9,651,584 | B2 * | 5/2017 | Gunn .................. G01R 35/005 |
| 2002/0167303 | A1 | 11/2002 | Nakano |
| 2007/0086130 | A1 * | 4/2007 | Sorensen ............... G01R 15/16 361/62 |
| 2009/0058398 | A1 | 3/2009 | Ibuki |
| 2010/0060300 | A1 | 3/2010 | Müller et al. |
| 2010/0090682 | A1 | 4/2010 | Armstrong |
| 2010/0283539 | A1 | 11/2010 | Yanagisawa |
| 2012/0200291 | A1 | 8/2012 | Carpenter et al. |
| 2012/0259565 | A1 * | 10/2012 | Oshima .................. G01R 21/06 702/61 |
| 2012/0290240 | A1 | 11/2012 | Fukui |
| 2013/0076343 | A1 * | 3/2013 | Carpenter .............. G01R 33/02 324/202 |
| 2013/0124136 | A1 | 5/2013 | Neeley et al. |
| 2013/0147464 | A1 * | 6/2013 | Tan ......................... G01R 1/22 324/126 |
| 2014/0035607 | A1 | 2/2014 | Heydron et al. |
| 2014/0062459 | A1 | 3/2014 | El-Essawy et al. |
| 2015/0042320 | A1 | 2/2015 | Cadugan et al. |
| 2016/0047846 | A1 * | 2/2016 | Sharma ................ G01R 15/207 324/251 |
| 2016/0080667 | A1 | 3/2016 | Stuart et al. |
| 2016/0109486 | A1 | 4/2016 | Yanagisawa |
| 2016/0119592 | A1 | 4/2016 | Stuart et al. |
| 2016/0187389 | A1 * | 6/2016 | Kshirsagar ......... G01R 19/0053 324/76.11 |
| 2018/0136264 | A1 * | 5/2018 | Steuer .................. G01R 19/257 |

FOREIGN PATENT DOCUMENTS

| | | |
|---|---|---|
| EP | 3 321 696 A1 | 5/2018 |
| EP | 3 450 995 A1 | 3/2019 |
| JP | 9-184866 A | 7/1997 |
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2014-44168 A | 3/2014 |
| JP | 2014-44169 A | 3/2014 |
| JP | 2016-3997 A | 1/2016 |

OTHER PUBLICATIONS

Fluke Corporation, "The 5700A/5720A Series II High Performance Multifunction Calibrators Extended Specifications," downloaded on Feb. 7, 2018 from http://download.flukecal.com/pub/literature/1268275Gw.pdf, 2012, 27 pages.

Fluke Corporation, "Clamp Meter Service Information," downloaded on Feb. 7, 2018 from http://www.industrialcalibration.co.uk/downloads/Fluke%2030%20Clamp%20Meter%20Service%20Date.pdf, 1998, 4 pages.

Galliana et al., "Traceable Technique to Calibrate Clamp Meters in AC Current From 100 to 1500 A," *IEEE Transactions on Instrumentation and Measurement* 61(9):2512-2518, 2012.

Hioki, "3258 : Safety HiTESTER," Revised Edition 5, Hioki E. E. Corporation, Nagano Japan, 2 pages.

Huber et al., "Non-Contact Voltage Measurement Systems," U.S. Appl. No. 62/421,124, filed Nov. 11, 2016, 122 pages.

Mitchell Instrument Company Inc., clipping from the Mitchell Catalogue, undated, 1 page.

Neeley et al., "Maintenance Management Systems and Methods," U.S. Appl. No. 61/514,842, filed Aug. 3, 2011, 22 pages.

Ringsrud et al., "Non-Contact Voltage Measurement System," U.S. Appl. No. 15/345,256, filed Nov. 7, 2016, 39 pages.

Rodriguez et al., "Non-Contact Current Measurement System," U.S. Appl. No. 15/604,320, filed May 24, 2017, 66 pages.

Steuer et al., "Non-Contact Electrical Parameter Measurement Systems," U.S. Appl. No. 15/625,745, filed Jun. 16, 2017, 130 pages.

Steuer et al., "Non-Contact Voltage Measurement System Using Multiple Capacitors," U.S. Appl. No. 15/412,891, filed Jan. 23, 2017, 35 pages.

Steuer et al., "Non-Contact Voltage Measurement System Using Reference Signal," U.S. Appl. No. 15/413,025, filed Jan. 23, 2017, 49 pages.

Stuart et al., "Combined Use of Digital Multimeter and Infrared Camera to Analyze and Diagnose Issues With Voltage Drop and Impedance," U.S. Appl. No. 62/051,930, filed Sep. 17, 2014, 3 pages.

Stuart et al., "Imaging System Employing Fixed, Modular Mobile, and Portable Infrared Cameras With Ability to Receive, Communicate, and Display Data and Images With Proximity Detection, "U.S. Appl. No. 62/068,392, filed Oct. 24, 2014, 9 pages.

Stuart et al., "Infrared Cameras Used as a Method to Trigger Operation and/or Recording of Test and Measurement Devices," U.S. Appl. No. 62/076,088, filed Nov. 6, 2014, 14 pages.

Takahashi, "Clamp on Power Logger PW3365: Safety Voltage Sensor PW9020," *HIOKI Technical Notes* 1(1): 2015, 8 pages.

Tsang et al., "Dual capacitive sensors for non-contact AC voltage measurement," *Sensors and Actuators A* 167:261-266, 2011.

Extended European Search Report for EP application No. 19173657.8 dated Sep. 26, 2019, 11 pages.

* cited by examiner

MULTI-SENSOR CONFIGURATION FOR NON-CONTACT VOLTAGE MEASUREMENT DEVICES

BACKGROUND

Technical Field

The present disclosure generally relates to voltage measurement devices, and more particularly, to sensors for voltage measurement devices.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least two measurement electrodes or probes into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution. A "non-contact" voltage measurement device may be used to detect the presence of alternating current (AC) voltage without requiring galvanic contact with the circuit. When a voltage is detected, the user is alerted by an indication, such as a light, buzzer, or vibrating motor. However, such non-contact voltage detectors provide only an indication of the presence or absence of an AC voltage, and do not provide an indication of the actual magnitude (e.g., RMS value) of the AC voltage.

Thus, there is a need for an AC voltage measurement system which provides convenient and accurate voltage measurements without requiring galvanic contact with the circuit being tested.

BRIEF SUMMARY

A device to measure alternating current (AC) in an insulated conductor may be summarized as including: a housing; a sensor subsystem physically coupled to the housing, the sensor subsystem selectively positionable proximate the insulated conductor without galvanically contacting the conductor, wherein the sensor subsystem capacitively couples with the insulated conductor, the sensor subsystem including a first sensor portion and a second sensor portion independent from the first sensor portion; a conductive internal ground guard which at least partially surrounds the sensor subsystem and is galvanically isolated from the sensor subsystem, the internal ground guard sized and dimensioned to shield the sensor subsystem from stray currents; a conductive reference shield which surrounds at least a portion of the housing and is galvanically insulated from the internal ground guard, the conductive reference shield sized and dimensioned to reduce currents between the internal ground guard and an external ground; a common mode reference voltage source which, in operation, generates an alternating current (AC) reference voltage having a reference frequency, the common mode reference voltage source electrically coupled between the internal ground guard and the conductive reference shield; input voltage signal conditioning circuitry selectively alternatingly coupleable to the first sensor portion and the second sensor portion of the sensor subsystem, wherein the input voltage signal conditioning circuitry, in operation, generates a sensor current signal indicative of current conducted through the sensor subsystem due to the input voltage of the insulated conductor under test; reference signal conditioning circuitry selectively alternatingly coupleable to the first sensor portion and the second sensor portion of the sensor subsystem, wherein the reference signal conditioning circuitry, in operation, generates a sensor current signal indicative of current conducted through the sensor subsystem due to the AC reference voltage detected in the insulated conductor under test; and control circuitry communicatively coupled to the input voltage signal conditioning circuitry and the reference signal conditioning circuitry, wherein, in operation, the control circuitry: receives sensor current signals from each of the input voltage signal conditioning circuitry and the reference signal conditioning circuitry; and determines the AC voltage in the insulated conductor based at least in part on the received sensor current signals, the AC reference voltage, and the reference frequency.

The first sensor portion may include a first plurality of spaced apart conductive sensors electrically coupled together, and the second sensor portion may include a second plurality of spaced apart conductive sensors electrically coupled together. The first plurality of conductive sensors of the first sensor portion may be interleaved with the second plurality of conductive sensors of the second sensor portion. The input voltage signal conditioning circuitry may be selectively alternatingly coupleable to the first sensor portion and the second sensor portion via a first switch, and wherein the reference signal conditioning circuitry may be selectively alternatingly coupleable to the first sensor portion and the second sensor portion via a second switch. The control circuitry, in operation, may control the states of the first and second switches synchronously to alternatingly: electrically couple the first sensor portion to the reference signal conditioning circuitry, and electrically couple the second sensor portion to the input voltage signal conditioning circuitry; and electrically couple the second sensor portion to the reference signal conditioning circuitry, and electrically couple the first sensor portion to the input voltage signal conditioning circuitry. The control circuitry, in operation, may control the states of the first and second switches synchronously at a 50 percent duty cycle. The control circuitry, in operation: may determine which of the first sensor portion and the second sensor portion generates the largest sensor current signals; and may determine the AC voltage in the insulated conductor based at least in part on the determination of which of the first sensor portion and the second sensor portion generates the largest sensor current signals. The control circuitry, in operation: may determine which of the first sensor portion and the second sensor portion generates the largest sensor current signals; may ignore the sensor current signals obtained from the one of the first and second sensor portions that generates the smallest sensor current signals; and may determine the AC voltage in the insulated conductor based at least in part on the sensor current signals obtained from the one of the first and second sensor portions that generates the largest sensor current signals. The control circuitry, in operation: may determine a weighted combination of the received sensor current signals received from the input voltage signal conditioning circuitry and the reference signal conditioning circuitry; and may determine the AC voltage in the insulated conductor based at least in part on the weighted combination of the received sensor current signals. The weighted combination of the received sensor current signals may include at least one of a linearly weighted combination or an exponentially weighted combination. Each of the input voltage signal conditioning circuitry and the reference signal conditioning circuitry may include at least one of an amplifier, a filter, or an analog-to-digital converter. The input voltage signal conditioning circuitry may be optimized to condition or process input voltage signals, and the reference signal conditioning circuitry may be optimized to condition or process AC reference voltage signals. The sensor subsystem and the conductive internal ground guard may each be non-planar in shape. The control circuitry may obtain a first measurement when the common mode reference voltage source is disabled, may obtain a second measurement when the common mode reference voltage source is enabled, and may determine the AC voltage in the insulated conductor based at least in part on the first and second measurements, the AC reference voltage and the reference frequency.

A method of operating a device to measure alternating current (AC) voltage in an insulated conductor may be summarized as including a housing, a sensor subsystem physically coupled to the housing, the sensor subsystem selectively positionable proximate the insulated conductor without galvanically contacting the conductor, wherein the sensor subsystem capacitively couples with the insulated conductor, the sensor subsystem including a first sensor portion and a second sensor portion independent from the first sensor portion, a conductive internal ground guard which at least partially surrounds the sensor subsystem and is galvanically isolated from the sensor subsystem, the internal ground guard sized and dimensioned to shield the sensor subsystem from stray currents, and a conductive reference shield which surrounds at least a portion of the housing and is galvanically insulated from the internal ground guard, the conductive reference shield sized and dimensioned to reduce currents between the internal ground guard and an external ground, the method further including: causing a common mode reference voltage source to generate an alternating current (AC) reference voltage having a reference frequency, the common mode reference voltage source electrically coupled between the internal ground guard and the conductive reference shield; generating, via input voltage signal conditioning circuitry electrically coupleable in an alternating fashion to the first sensor portion and the second sensor portion of the sensor subsystem, a sensor current signal indicative of current conducted through the sensor subsystem due to the input voltage detected in the insulated conductor under test; generating, via reference current signal conditioning circuitry electrically coupleable in an alternating fashion to the first sensor portion and the second sensor portion of the sensor subsystem, a sensor current signal indicative of current conducted through the sensor subsystem due to the AC reference voltage detected in the insulated conductor under test; receiving, by control circuitry, the sensor current signals from each of the input voltage signal conditioning circuitry and the reference signal conditioning circuitry; and determining, by the control circuitry, the AC voltage in the insulated conductor based at least in part on the received sensor current signals, the AC reference voltage, and the reference frequency.

A device to measure alternating current (AC) in an insulated conductor may be summarized as including: a first sensor portion including a first plurality of conductive sensors; a second sensor portion independent from the first sensor portion, the second sensor portion including a second plurality of conductive sensors; input voltage signal conditioning circuitry that, in operation, generates a sensor current signal indicative of current conducted through at least one of the first sensor portion and the second sensor portion due to the input voltage of the insulated conductor under test; reference signal conditioning circuitry that, in operation, generates a sensor current signal indicative of current conducted through the sensor subsystem due to an AC reference voltage generated by the device and detected in the insulated conductor under test; a first controllable switch operative to alternatively couple each of the first sensor portion and the second sensor portion to the input voltage signal conditioning circuitry; and a second controllable switch operative to alternatively couple each of the first sensor portion and the second sensor portion to the reference signal conditioning circuitry.

The device may further include: control circuitry communicatively coupled to the input voltage signal conditioning circuitry, the reference signal conditioning circuitry, the first controllable switch, and the second controllable switch, wherein, in operation, the control circuitry: controls the first controllable switch to alternatingly: couple the first sensor portion to the input voltage signal conditioning circuitry, and couple the second sensor portion to the input voltage signal conditioning circuitry; controls the second controllable switch to alternatingly: couple the first sensor portion to the reference signal conditioning circuitry, and couple the second sensor portion to the reference signal conditioning circuitry; receives sensor current signals from each of the input voltage signal conditioning circuitry and the reference signal conditioning circuitry; and determines the AC voltage in the insulated conductor based at least in part on the received sensor current signals. The control circuitry, in operation, may control the states of the first and second controllable switches synchronously at a 50 percent duty cycle. The first sensor portion may include a first plurality of spaced apart conductive sensors electrically coupled together, and the second sensor portion may include a second plurality of spaced apart conductive sensors electrically coupled together. The first plurality of conductive sensors of the first sensor portion may be interleaved with the second plurality of conductive sensors of the second sensor portion.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

One or more implementations of the present disclosure are directed to systems and methods for measuring alternating current (AC) voltage of an insulated or blank uninsulated conductor (e.g., insulated wire) without requiring a galvanic connection between the conductor and a test electrode or probe. Generally, a non-galvanic contact (or "non-contact") voltage measurement system is provided which measures an AC voltage signal in an insulated conductor with respect to ground using a capacitive sensor. Such systems which do not require a galvanic connection are referred to herein as "non-contact." As used herein, "electrically coupled" includes both direct and indirect electrical coupling unless stated otherwise. As discussed further below with reference to FIG. 5, in at least some implementations, two independent sensors are used to provide improved measurement with compensation for the position of the conductor under test and signal paths are split directly at the sensor input, into a reference signal and an input signal, by using signal separation methods, such as filters, synchronous rectification or other modulation methods. As discussed further below, this split can be used for optimizing, for example, sensitivity/range independently for reference and input signals to improve performance/accuracy and to reduce noise.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

The following discussion provides examples of systems and methods for measuring alternating current (AC) voltage of an insulated (e.g., insulated wire) or blank uninsulated conductor (e.g., bus bar) without requiring a galvanic connection between the conductor and a test electrode or probe. The implementations disclosed in this section may be referred to herein as "reference signal type voltage sensors" or systems. Generally, a non-galvanic contact (or "non-contact") voltage measurement device is provided which measures an AC voltage signal in an insulated conductor with respect to ground using a capacitive sensor. Such systems which do not require a galvanic connection are referred to herein as "non-contact." As used herein, "electrically coupled" includes both direct and indirect electrical coupling unless stated otherwise.

Figure 1A:
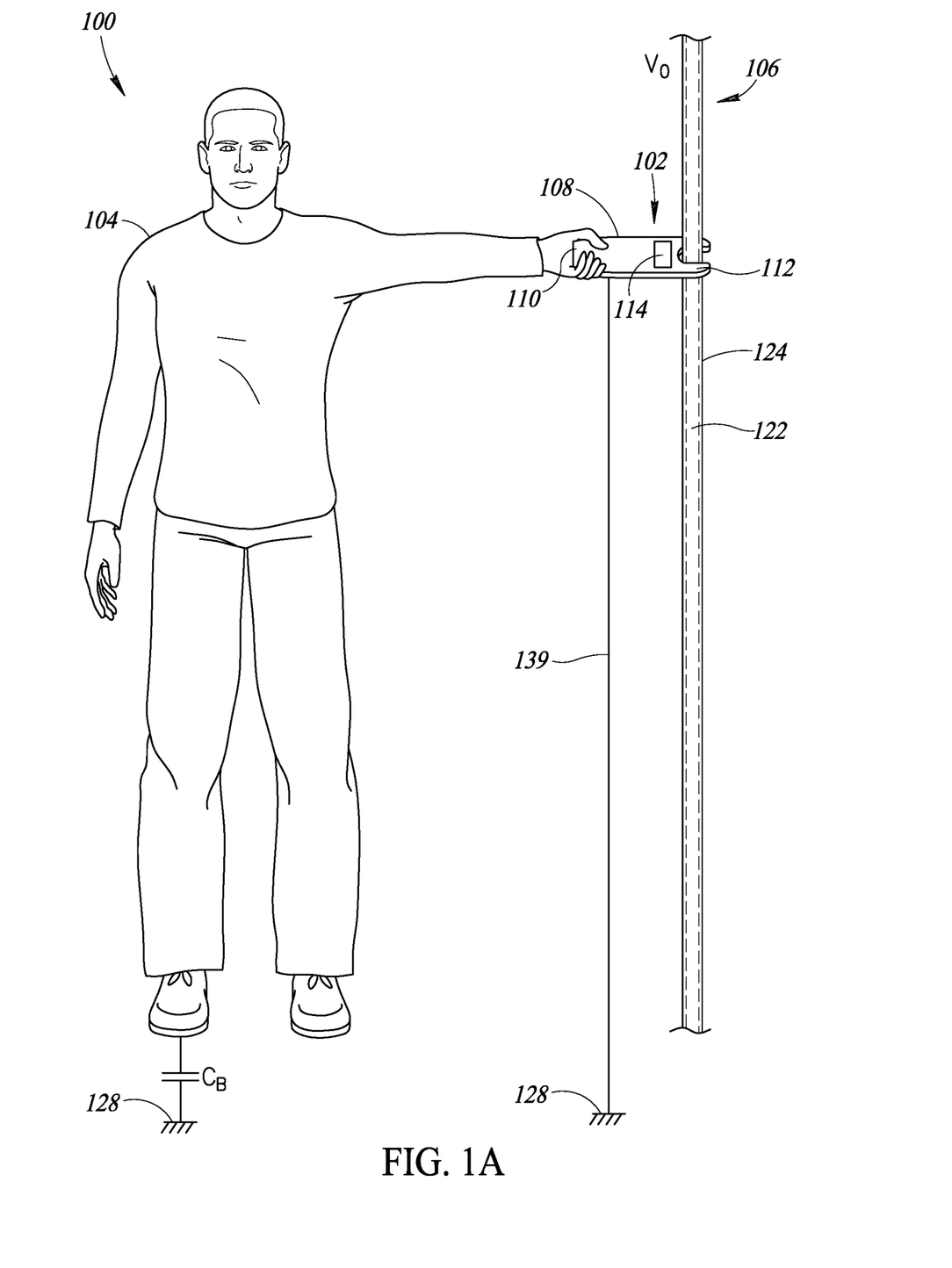
FIG. 1A is a pictorial diagram of an environment in which a non-contact voltage measurement device including a reference signal type voltage sensor may be used by an operator to measure AC voltage present in an insulated wire without requiring galvanic contact with the wire, according to one illustrated implementation.
Figure 1B:
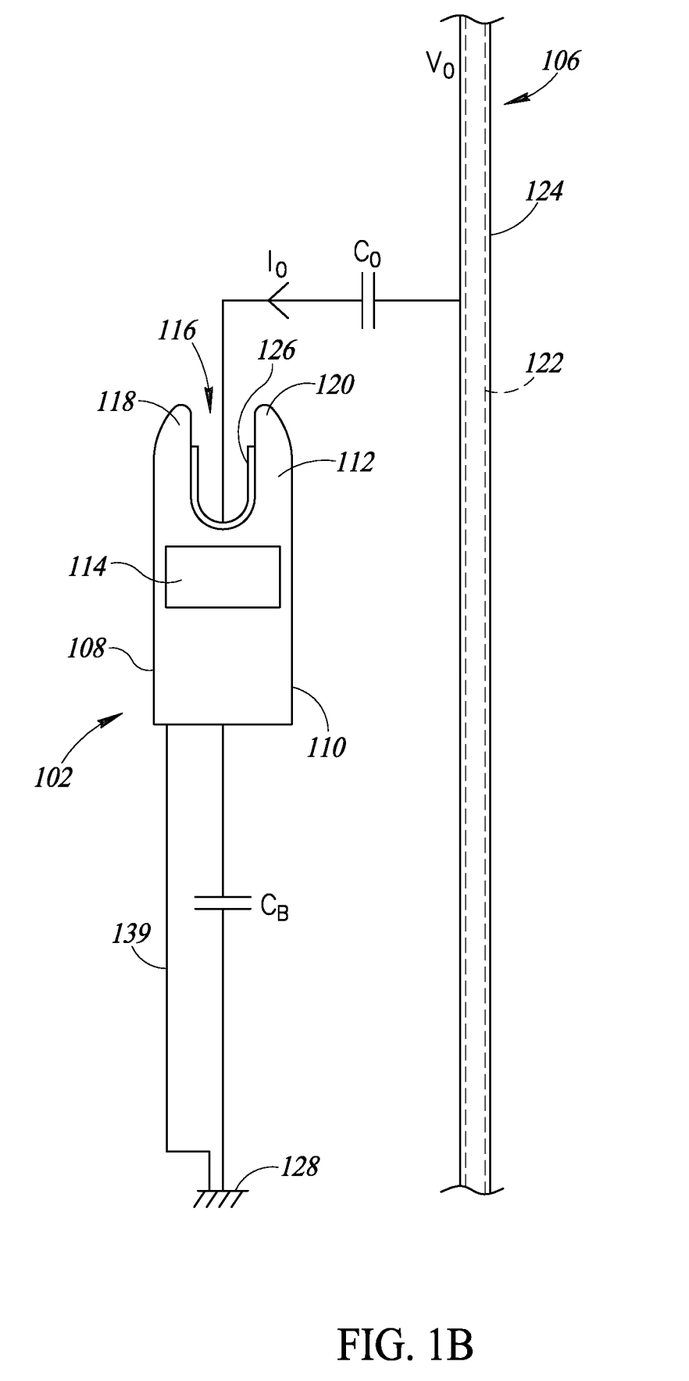
FIG. 1B is a top view of the non-contact voltage measurement device of FIG. 1A, showing a coupling capacitance formed between the insulated wire and a conductive sensor of the non-contact voltage measurement device, an insulated conductor current component, and a body capacitance between the non-contact voltage measurement device and the operator, according to one illustrated implementation.

FIG. 1A is a pictorial diagram of an environment 100 in which a non-contact voltage measurement device 102 that includes a reference signal type voltage sensor or system may be used by an operator 104 to measure AC voltage present in an insulated wire 106 without requiring galvanic contact between the non-contact voltage measurement device and the wire 106. FIG. 1B is a top plan view of the non-contact voltage measurement device 102 of FIG. 1A, showing various electrical characteristics of the non-contact voltage measurement device during operation. The non-contact voltage measurement device 102 includes a housing or body 108 which includes a grip portion or end 110 and a probe portion or end 112, also referred to herein as a front end, opposite the grip portion. The housing 108 may also include a user interface 114 which facilitates user interaction with the non-contact voltage measurement device 102. The user interface 114 may include any number of inputs (e.g., buttons, dials, switches, touch sensor) and any number of outputs (e.g., display, LEDs, speakers, buzzers). The non-contact voltage measurement device 102 may also include one or more wired and/or wireless communications interfaces (e.g., USB, Wi-Fi®, Bluetooth®).

In at least some implementations, as shown best in FIG. 1B, the probe portion 112 may include a recessed portion 116 defined by first and second extended portions 118 and 120. The recessed portion 116 receives the insulated wire 106 (see FIG. 1A). The insulated wire 106 includes a conductor 122 and an insulator 124 surrounding the conductor 122. The recessed portion 116 may include a sensor or electrode 126 which rests proximate the insulator 124 of the insulated wire 106 when the insulated wire is positioned within the recessed portion 116 of the non-contact voltage measurement device 102. Although not shown for clarity, the sensor 126 may be disposed inside of the housing 108 to prevent physical and electrical contact between the sensor and other objects.

As shown in FIG. 1A, in use the operator 104 may grasp the grip portion 110 of the housing 108 and place the probe portion 112 proximate the insulated wire 106 so that the non-contact voltage measurement device 102 may accurately measure the AC voltage present in the wire with respect to earth ground (or another reference node). Although the probe end 112 is shown as having the recessed portion 116, in other implementations the probe portion 112 may be configured differently. For example, in at least some implementations the probe portion 112 may include a selectively movable clamp, a hook, a flat or arcuate surface which includes the sensor, or other type of interface which allows a sensor of the non-contact voltage measurement device 102 to be positioned proximate the insulated wire 106. Examples of various probe portions and sensors are discussed below with reference to FIG. 5.

The operator's body acting as a reference to earth/ground may only be in some implementations. Alternatively a direct connection to earth 128 via a test lead 139 can be used. The non-contact measurement functionality discussed herein is not limited to applications only measuring against earth. The outside reference may be capacitively or directly coupled to any other potential. For example, if the outside reference is capacitively coupled to another phase in three phase systems, the phase-to-phase voltages are measured. In general, the concepts discussed herein are not limited to reference against earth only using a body capacitive coupling connected to a reference voltage and any other reference potential.

As discussed further below, in at least some implementations, the non-contact voltage measurement device 102 may utilize the body capacitance ($C_B$) between the operator 104 and ground 128 during the AC voltage measurement. Although the term ground is used for the node 128, the node is not necessarily earth/ground but could be connected in a galvanically isolated manner to any other reference potential by capacitive coupling.

The particular systems and methods used by the non-contact voltage measurement device 102 to measure AC voltage are discussed below with reference to FIGS. 2-4.

Figure 2:
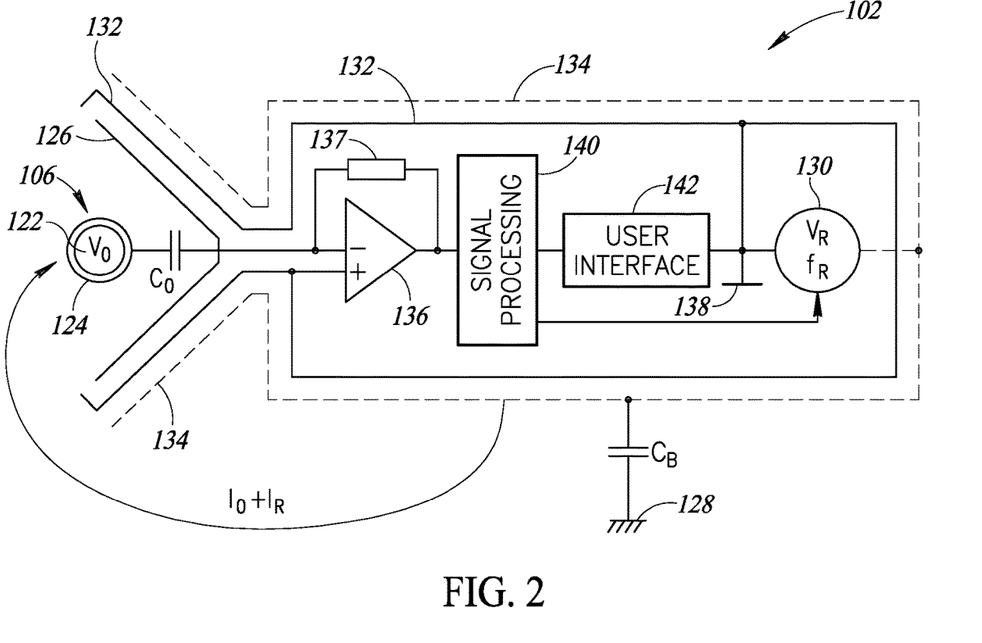
FIG. 2 is a schematic diagram of various internal components of a non-contact voltage measurement device, according to one illustrated implementation.

FIG. 2 shows a schematic diagram of various internal components of the non-contact voltage measurement device 102 also shown in FIGS. 1A and 1B. In this example, the conductive sensor 126 of the non-contact voltage measurement device 102 is substantially "V-shaped" and is positioned proximate the insulated wire 106 under test and capacitively couples with the conductor 122 of the insulated wire 106, forming a sensor coupling capacitor ($C_O$). The operator 104 handling the non-contact voltage measurement device 102 has a body capacitance ($C_B$) to ground. Also a direct conductive ground coupling by a wire (e.g., test lead 139) can be used as shown in FIGS. 1A and 1B. Thus, as shown in FIGS. 1B and 2, the AC voltage signal ($V_O$) in the wire 122 generates an insulated conductor current component or "signal current" ($I_O$) over the coupling capacitor ($C_O$) and the body capacitance ($C_B$), which are connected in series. In some implementations, the body capacitance ($C_B$) may also include a galvanically isolated test lead which generates a capacitance to ground or any other reference potential.

The AC voltage ($V_O$) in the wire 122 to be measured has a connection to an external ground 128 (e.g., neutral). The non-contact voltage measurement device 102 itself also has a capacitance to ground 128, which consists primarily of the body capacitance ($C_B$) when the operator 104 (FIG. 1) holds the non-contact voltage measurement device in his hand. Both capacitances $C_O$ and $C_B$ create a conductive loop and the voltage inside the loop generates the signal current ($I_O$). The signal current ($I_O$) is generated by the AC voltage signal ($V_O$) capacitively coupled to the conductive sensor 126 and loops back to the external ground 128 through the housing 108 of the non-contact voltage measurement device and the body capacitor ($C_B$) to ground 128. The current signal ($I_O$) is dependent on the distance between the conductive sensor 126 of the non-contact voltage measurement device 102 and the insulated wire 106 under test, the particular shape of the conductive sensor 126, and the size and voltage level ($V_O$) in the conductor 122.

To compensate for the distance variance and consequent coupling capacitor ($C_O$) variance which directly influences the signal current ($I_O$), the non-contact voltage measurement device 102 includes a common mode reference voltage source 130 which generates an AC reference voltage ($V_R$) which has a reference frequency ($f_R$) different from the signal voltage frequency ($f_O$).

To reduce or avoid stray currents, at least a portion of the non-contact voltage measurement device 102 may be surrounded by a conductive internal ground guard or screen 132 which causes most of the current to run through the conductive sensor 126 that forms the coupling capacitor ($C_O$) with the conductor 122 of the insulated wire 106. The internal ground guard 132 may be formed from any suitable conductive material (e.g., copper) and may be solid (e.g., foil) or have one or more openings (e.g., mesh).

Further, to avoid currents between the internal ground guard 132 and the external ground 128, the non-contact voltage measurement device 102 includes a conductive reference shield 134. The reference shield 134 may be formed from any suitable conductive material (e.g., copper) and may be solid (e.g. sheet metal, sputtered metal inside a plastic enclosure, flexible (e.g., foil), or have one or more openings (e.g., mesh). The common mode reference voltage source 130 is electrically coupled between the reference shield 134 and the internal ground guard 132, which creates a common mode voltage or reference signal having the reference voltage ($V_R$) and the reference frequency ($f_R$) for the non-contact voltage measurement device 102. Such AC reference voltage ($V_R$) drives an additional reference current ($I_R$) through the coupling capacitor ($C_O$) and the body capacitor ($C_B$).

The internal ground guard 132 which surrounds at least a portion of the conductive sensor 126 protects the conductive sensor against direct influence of the AC reference voltage ($V_R$) causing an unwanted offset of reference current ($I_R$) between the conductive sensor 126 and the reference shield 134. As noted above, the internal ground guard 132 is the internal electronic ground 138 for the non-contact voltage measurement device 102. In at least some implementations, the internal ground guard 132 also surrounds some or all of the electronics of the non-contact voltage measurement device 102 to avoid the AC reference voltage ($V_R$) coupling into the electronics.

As noted above, the reference shield 134 is utilized to inject a reference signal onto the input AC voltage signal ($V_O$) and, as a second function, minimizes the guard 132 to earth ground 128 capacitance. In at least some implementations, the reference shield 134 surrounds some or all of the housing 108 of the non-contact voltage measurement device 102. In such implementations, some or all of the electronics see the reference common mode signal which also generates the reference current ($I_R$) between the conductive sensor 126 and the conductor 122 in the insulated wire 106. In at least some implementations, the only gap in the reference shield 134 may be an opening for the conductive sensor 126 which allows the conductive sensor to be positioned proximate the insulated wire 106 during operation of the non-contact voltage measurement device 102.

The internal ground guard 132 and the reference shield 134 may provide a double layer screen around the housing 108 (see FIGS. 1A and 1B) of the non-contact voltage measurement device 102. The reference shield 134 may be disposed on an outside surface of the housing 108 and the internal ground guard 132 may function as an internal shield or guard. The conductive sensor 126 is shielded by the guard 132 against the reference shield 134 such that any reference current flow is generated by the coupling capacitor ($C_O$) between the conductive sensor 126 and the conductor 122 under test. The guard 132 around the sensor 126 also reduces stray influences of adjacent wires close to the sensor.

As shown in FIG. 2, the non-contact voltage measurement device 102 may include an input amplifier 136 which operates as an inverting current-to-voltage converter. The input amplifier 136 has a non-inverting terminal electrically coupled to the internal ground guard 132 which functions as the internal ground 138 of the non-contact voltage measurement device 102. An inverting terminal of the input amplifier 136 may be electrically coupled to the conductive sensor 126. Feedback circuitry 137 (e.g., feedback resistor) may also be coupled between the inverting terminal and the output terminal of the input amplifier 136 to provide feedback and appropriate gain for input signal conditioning.

The input amplifier 136 receives the signal current ($I_O$) and reference current ($I_R$) from the conductive sensor 126 and converts the received currents into a sensor current voltage signal indicative of the conductive sensor current at the output terminal of the input amplifier. The sensor current voltage signal may be an analog voltage, for example. The analog voltage may be fed to a signal processing module 140 which, as discussed further below, processes the sensor current voltage signal to determine the AC voltage ($V_O$) in the conductor 122 of the insulated wire 106. The signal processing module 140 may include any combination of digital and/or analog circuitry.

The non-contact voltage measurement device 102 may also include a user interface 142 (e.g., display) communicatively coupled to the signal processing module 140 to present the determined AC voltage ($V_O$) or to communicate by an interface to the operator 104 of the non-contact voltage measurement device.

Figure 3:
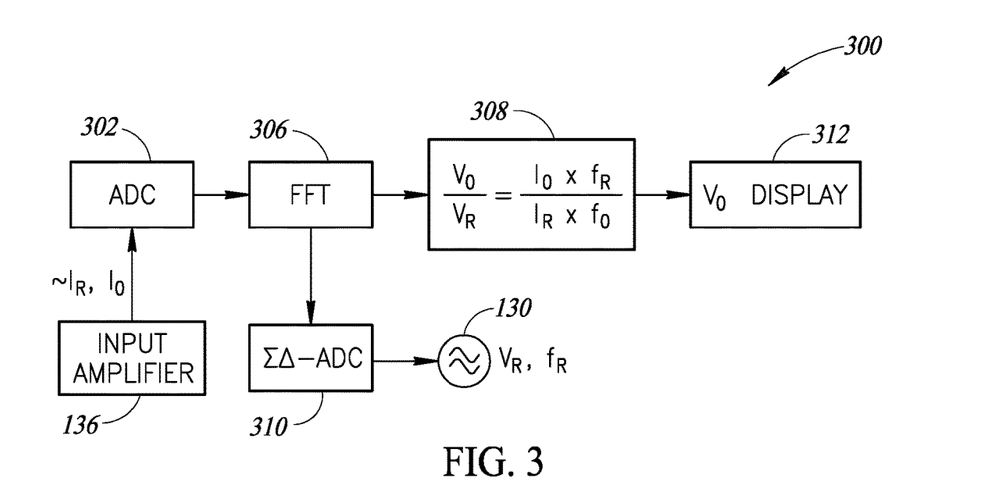
FIG. 3 is a block diagram which shows various signal processing components of a non-contact voltage measurement device, according to one illustrated implementation.
Figure 4:
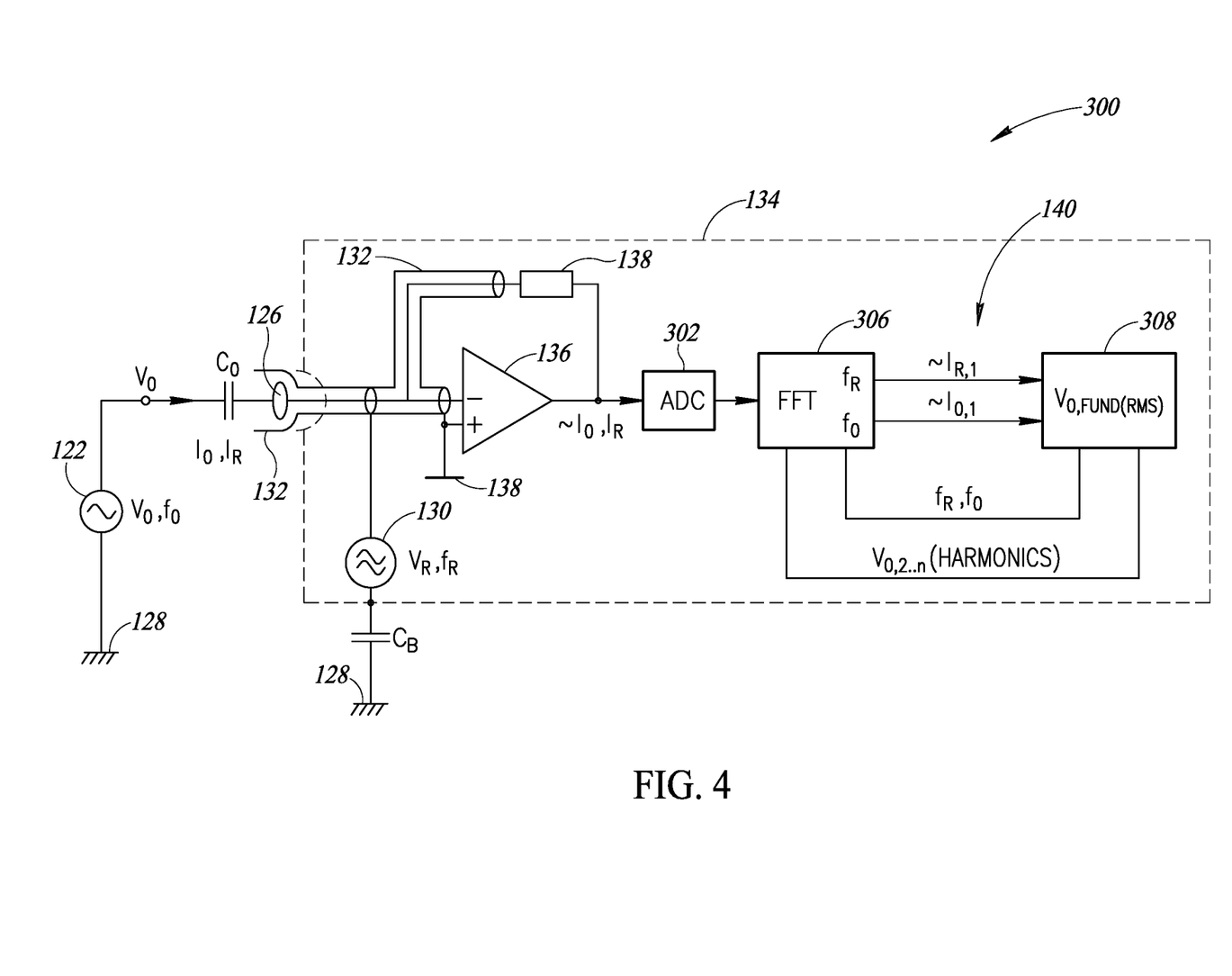
FIG. 4 is a schematic diagram of a non-contact voltage measurement device which implements a fast Fourier transform (FFT), according to one illustrated implementation.

FIG. 3 is a block diagram of a non-contact voltage measurement device 300 which shows various signal processing components of the non-contact voltage measurement device. FIG. 4 is a more detailed diagram of the non-contact voltage measurement device 300 of FIG. 3.

The non-contact voltage measurement device 300 may be similar or identical to the non-contact voltage measurement device 102 discussed above. Accordingly, similar or identical components are labeled with the same reference numerals. As shown, the input amplifier 136 converts the input current ($I_O+I_R$) from the conductive sensor 126 into a sensor current voltage signal which is indicative of the input current. The sensor current voltage signal is converted into digital form using an analog-to-digital converter (ADC) 302.

The AC voltage ($V_O$) in the wire 122 is related to the AC reference voltage ($V_R$) by Equation (1):

$$\frac{V_O}{V_R} = \frac{I_O \times f_R}{I_R \times f_O} \quad (1)$$

where ($I_O$) is the signal current through the conductive sensor 126 due to the AC voltage ($V_O$) in the conductor 122, ($I_R$) is the reference current through the conductive sensor 126 due to the AC reference voltage ($V_R$), ($f_O$) is the frequency of the AC voltage ($V_O$) that is being measured, and ($f_R$) is the frequency of the reference AC voltage ($V_R$).

The signals with indices "O," which are related to the AC voltage ($V_O$), have different characteristics like frequencies than the signals with indices "R," which are related to the common mode reference voltage source 130. In the implementation of FIG. 4, digital processing, such as circuitry implementing a fast Fourier transform (FFT) algorithm 306, may be used to separate signal magnitudes with different frequencies. In other implementations, analog electronic filters may also be used to separate "O" signal characteristics (e.g., magnitude, frequency) from "R" signal characteristics.

The currents ($I_O$) and ($I_R$) are dependent on the frequencies ($f_O$) and ($f_R$), respectively, due to the coupling capacitor ($C_O$). The currents flowing through the coupling capacitor ($C_O$) and the body capacitance ($C_B$) are proportional to the frequency and thus, the frequency ($f_O$) of the AC voltage ($V_O$) in the conductor 122 under test needs either to be measured to determine the ratio of the reference frequency ($f_R$) to the signal frequency ($f_O$), which is utilized in Equation (1) listed above or the reference frequency is already known because it is generated by the system itself.

After the input current ($I_O+I_R$) has been conditioned by the input amplifier 136 and digitized by the ADC 302, the frequency components of the digital sensor current voltage signal may be determined by representing the signal in the frequency domain using the FFT 306. When both of the frequencies ($f_O$) and ($f_R$) have been measured, frequency bins may be determined to calculate the fundamental magnitudes of the currents ($I_O$) and ($I_R$) from the FFT 306.

The magnitude of the current ($I_R$) and/or the current ($I_O$) may vary as a function of distance between the reference signal sensor or electrode (e.g., electrode 126) and the conductor 122 of the insulated wire 106. Thus, the system may compare the measured current ($I_R$) and/or the current ($I_O$) to expected respective currents to determine the distance between the reference signal sensor or electrode and the conductor 122.

Next, as indicated by a block 308 of FIG. 3, the ratio of the fundamental harmonics of the currents ($I_R$) and ($I_O$), designated $I_{R,1}$ and $I_{O,1}$, respectively may be corrected by the determined frequencies ($f_O$) and ($f_R$), and this factor may be used to calculate the measured original fundamental or RMS voltage by adding harmonics ($V_O$) in the wire 122, which is done by calculating the square root of the squared harmonics sum, and which may be presented to the user on a display 312.

The coupling capacitor ($C_O$) may generally have a capacitance value in the range of approximately 0.02 pF to 1 pF, for example, depending on the distance between the insulated conductor 106 and the conductive sensor 126, as well as the particular shape and dimensions of the sensor 126.

The body capacitance ($C_B$) may have a capacitance value of approximately 20 pF to 200 pF, for example.

From Equation (1) above, it can be seen that the AC reference voltage ($V_R$) generated by the common mode reference voltage source 130 does not need to be in the same range as the AC voltage ($V_O$) in the conductor 122 to achieve similar current magnitudes for the signal current ($I_O$) and the reference current ($I_R$). The AC reference voltage ($V_R$) may be relatively low (e.g., less than 5 V) by selecting the reference frequency ($f_R$) to be relatively high. As an example, the reference frequency ($f_R$) may be selected to be 3 kHz, which is 50 times higher than a typical 120 VRMS AC voltage ($V_O$) having a signal frequency ($f_O$) of 60 Hz. In such case, the AC reference voltage ($V_R$) may be selected to be only 2.4 V (i.e., 120 V÷50) to generate the same reference current ($I_R$) as the signal current ($I_O$). In general, setting the reference frequency ($f_R$) to be N times the signal frequency ($f_O$) allows the AC reference voltage ($V_R$) to have a value that is (1/N) times the AC voltage ($V_O$) in the wire 122 to produce currents ($I_R$) and ($I_O$) that are in the same range as each other to achieve a similar uncertainty for $I_R$ and $I_O$.

Any suitable signal generator may be used to generate the AC reference voltage ($V_R$) having the reference frequency ($f_R$). In the example illustrated in FIG. 3, a Sigma-Delta digital-to-analog converter ($\Sigma$-$\Delta$ DAC) 310 is used. The $\Sigma$-$\Delta$ DAC 310 uses a bit stream to create a waveform (e.g., sinusoidal waveform) signal with the defined reference frequency ($f_R$) and AC reference voltage ($V_R$). In at least some implementations, the $\Sigma$-$\Delta$ DAC 310 may generate a waveform that is in phase with the window of the FFT 306 to reduce jitter. Any other reference voltage generator can be used, such as a PWM which may use less computing power than a $\Sigma$-$\Delta$ DAC.

In at least some implementations, the ADC 302 may have 14 bits of resolution. In operation, the ADC 302 may sample the output from the input amplifier 136 at a sampling frequency of 10.24 kHz for nominal 50 Hz input signals to provide $2^n$ samples (1024) in 100 ms (10 Hz bins for the FFT 306) ready for processing by the FFT 306. For 60 Hz input signals, the sampling frequency may be 12.288 kHz, for example, to get the same number of samples per cycle. The sampling frequency of the ADC 302 may be synchronized to full numbers of cycles of the reference frequency ($f_R$). The input signal frequency may be within a range of 40-70 Hz, for example. Depending on the measured frequency of the AC voltage ($V_O$), the bins for the AC voltage ($V_O$) may be determined using the FFT 306 and use a Hanning window function for further calculations to suppress phase shift jitter caused by incomplete signal cycles captured in the aggregation interval.

In one example, the common mode reference voltage source 130 generates an AC reference voltage ($V_R$) which has a reference frequency ($f_R$) of 2419 Hz. This frequency is in between the $40^{th}$ harmonic and the $41^{st}$ harmonic for 60 Hz signals, and between the $48^{th}$ harmonic and $49^{th}$ harmonic for 50 Hz signals. By providing an AC reference voltage ($V_R$) which has a reference frequency ($f_R$) that is not a harmonic of the expected AC voltage ($V_O$), the AC voltage ($V_O$) is less likely to influence measurement of the reference current ($I_R$).

In at least some implementations, the reference frequency ($f_R$) of the common mode reference voltage source 130 is selected to be a frequency that is least likely to be affected by harmonics of an AC voltage ($V_O$) in the conductor 122 under test. As an example, the common mode reference voltage source 130 may be switched off when the reference current ($I_R$) exceeds a limit, which may indicate that the conductive sensor 126 is approaching the conductor 122 under test. A measurement (e.g., 100 ms measurement) may be taken with the common mode reference voltage source 130 switched off to detect signal harmonics at a number (e.g., three, five) of candidate reference frequencies. Then, the magnitude of the signal harmonics in the AC voltage ($V_O$) may be determined at the number of candidate reference frequencies to identify which candidate reference frequency is likely to be least affected by the signal harmonics of the AC voltage ($V_O$). The reference frequency ($f_R$) may then be set to the identified candidate reference frequency. This switching of the reference frequency may avoid or reduce the impact of possible reference frequency components in the signal spectrum, which may increase the measured reference signal and reduce accuracy, and may create unstable results. Other frequencies besides 2419 Hz that have the same characteristics include 2344 Hz and 2679 Hz, for example.

Figure 5:
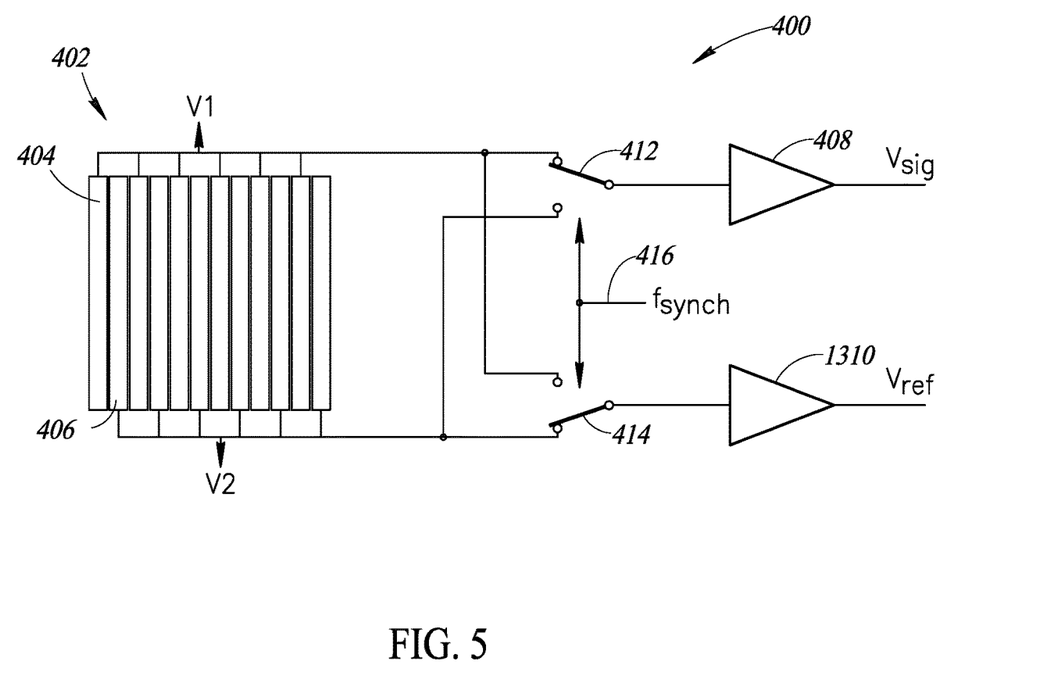
FIG. 5 is a schematic diagram of a sensor subsystem that includes a first sensor array portion having a first plurality of sensor elements, and a second sensor array portion having a second plurality of sensor elements, wherein the first plurality of sensor elements are interleaved with the second plurality of sensor elements, according to one illustrated implementation.

FIG. 5 is a schematic diagram of a sensor subsystem 400 that includes a sensor array 402. The sensor array 402 may be positioned and operated similar to the sensor array 126 shown in FIGS. 1B and 2, discussed above. The sensor array 402 may be planar in shape (as shown) or may be non-planar (e.g., U-shaped, V-shaped). The sensor array 402 includes a first independent sensor array portion having a first plurality of sensor elements 404 ("first sensor portion"). The sensor array 402 also includes a second independent sensor array portion having a second plurality of sensor elements 406 ("second sensor portion"). In at least some implementations, each of the plurality of sensor elements is elongated in a rectangular shape. In the illustrated example, the sensor elements of the first plurality of sensor elements 404 are interleaved with the sensor elements of the second plurality of sensor elements 406.

Each of the first plurality of sensor elements 404 is coupled to a node V1 that is alternatingly coupled to input voltage signal conditioning or processing circuitry 408 and reference current signal conditioning or processing circuitry 410 via controllable switches 412 and 414, respectively, that are controlled by a switch control signal ($f_{synch}$) 416 operated by control circuitry (e.g., a processor). Similarly, each of the second plurality of sensor elements 406 is coupled to a node V2 that is alternatingly coupled to the input voltage signal conditioning circuitry 408 and the reference current signal conditioning circuitry 410 via the switches 412 and 414, respectively. The input voltage signal conditioning circuitry 408 may include processing circuitry configured for processing signal currents $I_O$, and the reference current signal conditioning circuitry 410 may be configured for processing reference currents $I_R$. The input voltage signal conditioning circuitry 408 and the reference current signal conditioning circuitry 410 may each include similar processing circuitry to that discussed above (e.g., amplifiers, filters, ADCs, etc.), specially configured for measuring voltage input signal and reference current signals, respectively.

Each of the first plurality of sensor elements 404 and the second plurality of sensor elements 406 may be the same shape to separate the signal and reference currents prior to the signal conditioning circuitry. This configuration allows for use of different filters and amplification for the signal current and the reference current to optimize signal quality and range for both signals.

To compensate for any position dependent unbalance, especially at the edges, the switch control 416 may operate with a 50% duty cycle to alternatingly couple the first plurality of sensors 404 to the input voltage signal conditioning circuitry 408 and the signal conditioning circuitry 410, and to alternatingly couple the second plurality of sensors 406 to the input voltage signal conditioning circuitry 408 and the signal conditioning circuitry 410. This has the effect of averaging out any local geometric unbalance.

In at least some implementations, the signal magnitude for each of the first and second plurality of sensors 404 and 406 will be 50% of the signal magnitude compared to a single, larger sensor. However, since the signal current and the reference current are processed separately, signal conditioning circuitry (e.g., gain, frequency) may be advantageously optimized for each of the particular currents.

In at least some implementations, the switching frequency ($f_{synch}$) may be synchronized to the measurement interval (e.g., 100 ms), to ensure that full cycles are averaged. For example, the switching frequency may be selected to switch with full cycles of the reference frequency $f_R$ or greater than 2× the reference frequency and at multiple values of the reference frequency.

In at least some implementations, the first and second sets of sensor elements 404 and 406 will be "polled," and the set of sensor elements that has the greatest signal (e.g., reference current signal, input voltage signal) will be used for processing. In at least some implementations, signals from the two sets will both be used equally. In at least some implementations, a weighted combination of the two sets 404 and 406 may be used, e.g., linearly, exponentially, or otherwise weighted based on the magnitude of the each of the signals from the first and second sets of sensor elements.

As noted above, an advantage of directly separating the input voltage signal and the reference current signal is improved accuracy and dynamic range. The gain and frequency bandwidth can be optimized in each of the split signal paths for the low frequency input voltage signal (e.g., 50-60 Hz) and the higher frequency reference current signal (e.g., 2.5 kHz). This feature also reduces noise effects and reduces the dynamic range required for the ADC. Additionally, physically switching the sensor strips as discussed above makes the position effects (on both sides) independent of the position of the conductor under test.

In at least some implementations, three or more sensors or sensor arrays may be used to further compensate for the position (e.g., XY, XYZ) of the conductor under test. One example application is a non-contact voltage measurement device that utilizes a hard jaw current clamp, wherein the position of the conductor under test may be anywhere within the jaw.

In at least some implementations of the voltage measurement devices discussed herein, the reference voltage ($V_R$) may have multiple frequencies to reduce signal harmonics or interharmonic influence on the measured reference current ($I_R$) caused by higher frequency components of the signal voltage ($V_O$). For example, the reference voltage source (e.g., source 130 of FIG. 2) may be periodically switched off and the FFT frequency bins around the multiple reference frequencies may be analyzed and checked against a relative limit. The lowest value may be used to define a selected reference frequency ($f_R$) that is least disturbed by the signal voltage ($V_O$) or other influencing factors.

In at least some implementations, the switching off of the reference voltage source may not necessarily generate a gap in the measurement stream. For example, the signal current ($I_O$) may still be measured when the reference voltage source is switched off, and a reference current ($I_R$) measured during the previous interval may be used to estimate the reference current for the interval in which the reference voltage source is switched off.

In addition to the reference frequency switching discussed above, other dedicated signal characteristics of the reference signal may be used. Examples include amplitude or frequency modulation, synchronous or pseudo-stochastic switching, quadrature modulation, phase switching, etc.

As an example of using a modulated signal, the reference signal may be modulated with a modulation frequency $f_m$. In at least some implementations, the modulation frequency $f_m$ may be selected to lie exactly at an integer number of FFT bins. For example, for a 100 ms FFT interval, such frequencies would be frequencies of 10 Hz, 20 Hz, 30 Hz, etc. In the absence of noise at the carrier or reference frequency ($f_R$), this results in two symmetrical side bands, one on each side of the reference frequency.

If both of the two side bands do not have the same magnitude, it can be determined that the reference signal is disturbed (e.g., by the signal voltage ($V_O$)). This is a relatively simple identification process that does not require switching the reference voltage source off. If the reference signal is found to be disturbed, the system may shift the reference frequency by an amount $\Delta f$ and again check the side bands for symmetry until a suitable (undisturbed) reference frequency is identified.

To further speed up the process, in at least some implementations, multiple reference frequencies may be used at the same time. This frequency mixture can be created either by predetermined tables and bit streaming (e.g., $\Sigma\Delta$ DAC bit streaming), or by analog addition of low pass filtered outputs of pulse width modulators (PWM), for example. If PWMs are used, a pair of PWMs may provide a reference frequency and a modulation frequency, and multiple pairs of PWMs may be used to provide multiple reference frequencies and multiple corresponding modulation frequencies.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A device to measure alternating current (AC) in an insulated conductor, the device comprising:
   a housing;
   a sensor subsystem physically coupled to the housing, the sensor subsystem selectively positionable proximate the insulated conductor without galvanically contacting the conductor, wherein the sensor subsystem capacitively couples with the insulated conductor, the sensor subsystem comprising a first sensor portion and a second sensor portion independent from the first sensor portion;
   a conductive internal ground guard which at least partially surrounds the sensor subsystem and is galvanically isolated from the sensor subsystem, the internal ground guard sized and dimensioned to shield the sensor subsystem from stray currents;
   a conductive reference shield which surrounds at least a portion of the housing and is galvanically insulated from the internal ground guard, the conductive reference shield sized and dimensioned to reduce currents between the internal ground guard and an external ground;
   a common mode reference voltage source which, in operation, generates an alternating current (AC) reference voltage having a reference frequency, the common mode reference voltage source electrically coupled between the internal ground guard and the conductive reference shield;
   input voltage signal conditioning circuitry selectively alternatingly coupleable to the first sensor portion and the second sensor portion of the sensor subsystem, wherein the input voltage signal conditioning circuitry, in operation, generates a sensor current signal indicative of current conducted through the sensor subsystem due to the input voltage of the insulated conductor under test;
   reference signal conditioning circuitry selectively alternatingly coupleable to the first sensor portion and the second sensor portion of the sensor subsystem, wherein the reference signal conditioning circuitry, in operation, generates a sensor current signal indicative of current conducted through the sensor subsystem due to the AC reference voltage detected in the insulated conductor under test; and
   control circuitry communicatively coupled to the input voltage signal conditioning circuitry and the reference signal conditioning circuitry, wherein, in operation, the control circuitry:
      receives sensor current signals from each of the input voltage signal conditioning circuitry and the reference signal conditioning circuitry; and
      determines the AC voltage in the insulated conductor based at least in part on the received sensor current signals, the AC reference voltage, and the reference frequency.

2. The device of claim 1, wherein the first sensor portion comprises a first plurality of spaced apart conductive sensors electrically coupled together, and the second sensor portion comprises a second plurality of spaced apart conductive sensors electrically coupled together.

3. The device of claim 2, wherein the first plurality of conductive sensors of the first sensor portion are interleaved with the second plurality of conductive sensors of the second sensor portion.

4. The device of claim 1, wherein the input voltage signal conditioning circuitry is selectively alternatingly coupleable to the first sensor portion and the second sensor portion via a first switch, and wherein the reference signal conditioning circuitry is selectively alternatingly coupleable to the first sensor portion and the second sensor portion via a second switch.

5. The device of claim 4, wherein the control circuitry, in operation, controls the states of the first and second switches synchronously to alternatingly:
   electrically couple the first sensor portion to the reference signal conditioning circuitry, and electrically couple the second sensor portion to the input voltage signal conditioning circuitry; and
   electrically couple the second sensor portion to the reference signal conditioning circuitry, and electrically couple the first sensor portion to the input voltage signal conditioning circuitry.

6. The device of claim 5, wherein the control circuitry, in operation, controls the states of the first and second switches synchronously at a 50 percent duty cycle.

7. The device of claim 1, wherein the control circuitry, in operation:
   determines which of the first sensor portion and the second sensor portion generates the largest sensor current signals; and
   determines the AC voltage in the insulated conductor based at least in part on the determination of which of the first sensor portion and the second sensor portion generates the largest sensor current signals.

8. The device of claim 7, wherein the control circuitry, in operation:
   determines which of the first sensor portion and the second sensor portion generates the largest sensor current signals;
   ignores the sensor current signals obtained from the one of the first and second sensor portions that generates the smallest sensor current signals; and
   determines the AC voltage in the insulated conductor based at least in part on the sensor current signals obtained from the one of the first and second sensor portions that generates the largest sensor current signals.

9. The device of claim 1, wherein the control circuitry, in operation:
   determines a weighted combination of the received sensor current signals received from the input voltage signal conditioning circuitry and the reference signal conditioning circuitry; and determines the AC voltage in the insulated conductor based at least in part on the weighted combination of the received sensor current signals.

10. The device of claim 1, wherein the weighted combination of the received sensor current signals comprises at least one of a linearly weighted combination or an exponentially weighted combination.

11. The device of claim 1 wherein each of the input voltage signal conditioning circuitry and the reference signal conditioning circuitry comprises at least one of an amplifier, a filter, or an analog-to-digital converter.

12. The device of claim 1 wherein the input voltage signal conditioning circuitry is optimized to condition or process input voltage signals, and the reference signal conditioning circuitry is optimized to condition or process AC reference voltage signals.

13. The device of claim 1 wherein the sensor subsystem and the conductive internal ground guard are each non-planar in shape.

14. The device of claim 1 wherein the control circuitry obtains a first measurement when the common mode reference voltage source is disabled, obtains a second measurement when the common mode reference voltage source is enabled, and determines the AC voltage in the insulated conductor based at least in part on the first and second measurements, the AC reference voltage and the reference frequency.

15. A method of operating a device to measure alternating current (AC) voltage in an insulated conductor, the device comprising a housing, a sensor subsystem physically coupled to the housing, the sensor subsystem selectively positionable proximate the insulated conductor without galvanically contacting the conductor, wherein the sensor subsystem capacitively couples with the insulated conductor, the sensor subsystem comprising a first sensor portion and a second sensor portion independent from the first sensor portion, a conductive internal ground guard which at least partially surrounds the sensor subsystem and is galvanically isolated from the sensor subsystem, the internal ground guard sized and dimensioned to shield the sensor subsystem from stray currents, and a conductive reference shield which surrounds at least a portion of the housing and is galvanically insulated from the internal ground guard, the conductive reference shield sized and dimensioned to reduce currents between the internal ground guard and an external ground, the method comprising:
  causing a common mode reference voltage source to generate an alternating current (AC) reference voltage having a reference frequency, the common mode reference voltage source electrically coupled between the internal ground guard and the conductive reference shield;
  generating, via input voltage signal conditioning circuitry electrically coupleable in an alternating fashion to the first sensor portion and the second sensor portion of the sensor subsystem, a sensor current signal indicative of current conducted through the sensor subsystem due to the input voltage detected in the insulated conductor under test;
  generating, via reference current signal conditioning circuitry electrically coupleable in an alternating fashion to the first sensor portion and the second sensor portion of the sensor subsystem, a sensor current signal indicative of current conducted through the sensor subsystem due to the AC reference voltage detected in the insulated conductor under test;
  receiving, by control circuitry, the sensor current signals from each of the input voltage signal conditioning circuitry and the reference signal conditioning circuitry; and
  determining, by the control circuitry, the AC voltage in the insulated conductor based at least in part on the received sensor current signals, the AC reference voltage, and the reference frequency.

16. A device to measure alternating current (AC) in an insulated conductor, the device comprising:
  a first sensor portion comprising a first plurality of conductive sensors;
  a second sensor portion independent from the first sensor portion, the second sensor portion comprising a second plurality of conductive sensors;
  input voltage signal conditioning circuitry that, in operation, generates a sensor current signal indicative of current conducted through at least one of the first sensor portion and the second sensor portion due to the input voltage of the insulated conductor under test;
  reference signal conditioning circuitry that, in operation, generates a sensor current signal indicative of current conducted through the sensor subsystem due to an AC reference voltage generated by the device and detected in the insulated conductor under test;
  a first controllable switch operative to alternatively couple each of the first sensor portion and the second sensor portion to the input voltage signal conditioning circuitry; and
  a second controllable switch operative to alternatively couple each of the first sensor portion and the second sensor portion to the reference signal conditioning circuitry.

17. The device of claim 16, further comprising:
  control circuitry communicatively coupled to the input voltage signal conditioning circuitry, the reference signal conditioning circuitry, the first controllable switch, and the second controllable switch, wherein, in operation, the control circuitry:
    controls the first controllable switch to alternatingly: couple the first sensor portion to the input voltage signal conditioning circuitry, and couple the second sensor portion to the input voltage signal conditioning circuitry;
    controls the second controllable switch to alternatingly: couple the first sensor portion to the reference signal conditioning circuitry, and couple the second sensor portion to the reference signal conditioning circuitry;
    receives sensor current signals from each of the input voltage signal conditioning circuitry and the reference signal conditioning circuitry; and
    determines the AC voltage in the insulated conductor based at least in part on the received sensor current signals.

18. The device of claim 17, wherein the control circuitry, in operation, controls the states of the first and second controllable switches synchronously at a 50 percent duty cycle.

19. The device of claim 16, wherein the first sensor portion comprises a first plurality of spaced apart conductive sensors electrically coupled together, and the second sensor portion comprises a second plurality of spaced apart conductive sensors electrically coupled together.

20. The device of claim 19, wherein the first plurality of conductive sensors of the first sensor portion are interleaved with the second plurality of conductive sensors of the second sensor portion.

* * * * *